(12) United States Patent
Shimoda et al.

(10) Patent No.: US 6,919,680 B2
(45) Date of Patent: Jul. 19, 2005

(54) ORGANIC ELECTROLUMINESCENT DISPLAY AND MANUFACTURING METHOD THEREOF, ELECTRO-OPTIC DEVICE AND MANUFACTURING METHOD THEREOF, AND ELECTRONIC DEVICE

(75) Inventors: Tatsuya Shimoda, Nagano-ken (JP); Satoru Miyashita, Chino (JP); Satoshi Inoue, Nagano (JP)

(73) Assignee: Seiko Epson Corporation (JP)

( * ) Notice: Subject to any disclaimer, the term of this patent is extended or adjusted under 35 U.S.C. 154(b) by 118 days.

(21) Appl. No.: 09/900,738

(22) Filed: Jul. 6, 2001

(65) Prior Publication Data

US 2002/0158577 A1 Oct. 31, 2002

(30) Foreign Application Priority Data

Jul. 7, 2000 (JP) ..................................... P2000-207390
Jul. 3, 2001 (JP) ....................................... 2001-201712

(51) Int. Cl.$^7$ ................................................ H01J 1/62
(52) U.S. Cl. ........................... 313/498; 445/24; 445/25; 313/512
(58) Field of Search ..................... 445/24, 25; 313/511, 313/512, 500, 505, 498, 506, 509

(56) References Cited

U.S. PATENT DOCUMENTS

| | | | | |
|---|---|---|---|---|
| 3,161,797 A | * | 12/1964 | Butler et al. ................. | 313/512 |
| 5,188,984 A | * | 2/1993 | Nishiguchi .................. | 438/107 |
| 5,309,060 A | * | 5/1994 | Sharpless et al. ........... | 313/511 |
| 5,483,120 A | * | 1/1996 | Murakami ................... | 313/506 |
| 5,545,291 A | | 8/1996 | Smith et al. | |
| 5,693,962 A | * | 12/1997 | Shi et al. .................... | 313/502 |
| 5,783,856 A | | 7/1998 | Smith et al. | |
| 5,808,412 A | * | 9/1998 | Zovko et al. ............... | 313/509 |
| 5,824,186 A | | 10/1998 | Smith et al. | |
| 5,904,545 A | | 5/1999 | Smith et al. | |
| 6,039,896 A | * | 3/2000 | Miyamoto et al. .......... | 252/511 |
| 6,091,194 A | * | 7/2000 | Swirbel et al. ............. | 313/498 |
| 6,291,896 B1 | * | 9/2001 | Smith ......................... | 257/786 |
| 6,309,912 B1 | * | 10/2001 | Chiou et al. ................ | 438/118 |
| 6,341,994 B1 | * | 1/2002 | Ootsuki et al. ............... | 445/24 |
| 6,417,025 B1 | * | 7/2002 | Gengel ....................... | 438/107 |
| 6,551,724 B2 | * | 4/2003 | Ishii et al. .................. | 428/690 |
| 6,590,346 B1 | * | 7/2003 | Hadley et al. ........... | 315/169.3 |
| 6,693,384 B1 | * | 2/2004 | Vicentini et al. ........ | 315/169.1 |

* cited by examiner

Primary Examiner—Vip Patel
Assistant Examiner—Anthony Perry
(74) Attorney, Agent, or Firm—Harness, Dickey & Pierce, P.L.C.

(57) ABSTRACT

An object is to efficiently manufacture an organic EL display. A circuit substrate 10 in which is set microstructures 12 and which is formed with wiring 14, and a transparent substrate 20 formed with a transparent electrode 21, an emissive layer 25 and a cathode layer 26, are stuck together with the side formed with the wiring 14 and the side formed with the cathode layer 26 facing the inside, to thereby manufacture an organic EL display 30. In the sticking together of the circuit substrate 10 and the transparent substrate 20, an anisotropic conductive paste or an anisotropic conductive film can be used.

27 Claims, 5 Drawing Sheets

ORGANIC ELECTROLUMINESCENT DISPLAY AND MANUFACTURING METHOD THEREOF, ELECTRO-OPTIC DEVICE AND MANUFACTURING METHOD THEREOF, AND ELECTRONIC DEVICE

BACKGROUND OF THE INVENTION

1. Field of the Invention

The present invention relates to the construction of an organic electroluminescent (hereunder EL for short) display and a manufacturing method thereof, to an electro-optic device and a manufacturing method thereof, and to an electronic device. In particular the invention is one where, in a manufacturing method for a display incorporating microstructures made with drive circuits for organic EL elements, the organic EL display can be manufactured extremely efficiently.

2. Description of Related Art

Heretofore, there is a method of manufacturing an electronic device using microstructures made with electronic circuit elements (refer for example to U.S. Pat. Nos. 5,904,545, 5,824,186, 5,783,856, and 5,545,291).

That is, there is a manufacturing method which uses microstructures, and which enjoys for example the advantage that even with a configuration where a plurality of electronic circuits are scattered over a substrate of an electronic device, the semiconductor material need not be wasted.

Therefore, the present inventors and others, as a result of earnest research, as a means of utilizing microstructures in an organic EL display and a manufacturing method thereof, have completed a manufacturing method for obtaining an organic EL display involving firstly, making a drive circuit for an organic EL element within a microstructure and arranging this on a transparent substrate, and then performing in sequence; a wiring forming step a transparent electrode forming step, an emissive layer forming step and a cathode forming step. However while undoubtedly it has been shown that the organic EL display can be manufactured while enjoying the advantages from such a microstructure, in practice in order to mass produce the organic EL display with a profit base, further improvement is desired. Furthermore, this type of problem is also a common problem for electro-optic devices other than organic EL displays.

BRIEF SUMMARY OF THE INVENTION

The present invention has resulted due to such requirements, with the object of providing a method and an organic EL display construction whereby an organic EL display can be manufactured extremely efficiently, or a method and an electro-optic device construction whereby an electro-optic device can be manufactured extremely efficiently.

In order to achieve the above object, a first aspect of the present invention is a manufacturing method for a display which uses an organic EL element in a display portion, involving respectively preparing a circuit substrate with microstructures made with drive circuits for the organic EL element set at positions corresponding to pixels, and with wiring formed on the surface, and a transparent substrate with a transparent electrode layer common with the pixels laminated on the surface, and an emissive layer containing the organic EL layer and a cathode layer laminated on the upper surface of the transparent electrode layer at a position corresponding to the pixels, and then sticking together the circuit substrate and the transparent substrate with the side on which the wiring of the circuit substrate is formed and the side on which the cathode layer of the transparent substrate is formed facing towards the inside.

A second aspect of the present invention is that in the manufacturing method for an organic EL display being the first aspect, the sticking together of the circuit substrate and the transparent substrate being performed by inserting an anisotropic conductive paste or an anisotropic conductive film therebetween.

The anisotropic conductive paste and anisotropic conductive film are already known products, being a paste and film which can be used as an adhesive. In the case where this is thinly interposed between the two members as an adhesive, this exhibits a low electrical resistance in the film thickness direction, and exhibits a high electrical resistance in the direction along the surface of the film.

A third aspect of the present invention is that in the manufacturing method for an organic EL display being the first aspect, this involves respectively preparing a roll of the circuit substrate, and a roll of the transparent substrate, and then unrolling the circuit substrate and the transparent substrate from these rolls while inserting an anisotropic conductive film therebetween, and pressing with a pressing roll from front and rear surfaces to thereby stick together the circuit substrate and the transparent substrate.

A fourth aspect of the present invention is that in the manufacturing method for an organic EL display being the third aspect, after sticking together the circuit substrate and the transparent substrate, the stuck together product being cut to an optional length.

In order to achieve the above object, a fifth aspect of the present invention is a display which uses an organic EL element in a display portion, microstructures made with drive circuits for the organic EL element being set at positions corresponding to pixels of a first substrate, and an emissive layer containing an organic EL layer being formed on at least one of the first substrate and a second substrate, and these first substrate and second substrate being stuck together. That is, the emissive layer containing the organic EL layer may be formed on either one of the first substrate and the second substrate, or may be formed on both substrates, and the first substrate and the second substrate are stuck together so as to face each other through the emissive layer containing the organic EL layer.

Moreover, a sixth aspect of the present invention is a display which uses an organic EL element in a display portion, a circuit substrate with microstructures made with drive circuits for the organic EL element set at positions corresponding to pixels, and with wiring formed on the surface, and a transparent substrate with a transparent electrode layer common with the pixels laminated on the surface, and an emissive layer containing the organic EL layer and a cathode layer laminated on the upper surface of the transparent electrode layer at a position corresponding to the pixels, being stuck together with the side on which the wiring of the circuit substrate is formed and the side on which the cathode layer of the transparent substrate is formed facing towards the inside.

A seventh aspect of the present invention is that in the organic EL display being the sixth aspect, the circuit substrate and the transparent substrate being stuck together by inserting an anisotropic conductive paste or an anisotropic conductive film therebetween.

In order to achieve the above object, an eighth aspect of the present invention is a manufacturing method for an electro-optic device which uses electro-optic elements in a display portion, involving respectively preparing a first substrate with microstructures formed with drive circuits for the electro-optic elements set at positions corresponding to pixels, and a second substrate with the electro-optic elements formed at positions corresponding to the pixels, and then sticking together the first substrate and the second substrate with the side of the first substrate on which the drive circuits are formed and the side of the second substrate on which the electro-optic elements are formed facing towards the inside. Here "electro-optic element" is an element such as for example the abovementioned organic EL element, or a liquid crystal element.

A ninth aspect of the present invention is an electro-optic device which uses electro-optic elements in a display portion, microstructures made with drive circuits for the electro-optic elements being set at positions corresponding to pixels of a first substrate, and an electro-optic layer being formed on at least one of the first substrate and a second substrate, and the first substrate and second substrate being stuck together. Here "electro-optic layer" may be a layer such as for example the abovementioned emissive layer containing the organic EL layer, or a film liquid crystal.

Furthermore, a ninth aspect of the present invention is characterized in that the electro-optic device of the abovementioned ninth aspect is provided.

According to the present invention, since an organic EL display is manufactured by sticking together a circuit substrate in which microstructures are set, and an emissive substrate formed with an emissive layer and the like, there is the effect that the organic EL display can be manufactured extremely efficiently.

In particular, according to the third and fourth aspects, since the organic EL display can be continuously manufactured, a reduction in manufacturing cost can also be achieved.

DETAILED DESCRIPTION OF THE INVENTION

Hereunder is a description of embodiments of the present invention based on the drawings.

Figure 1:
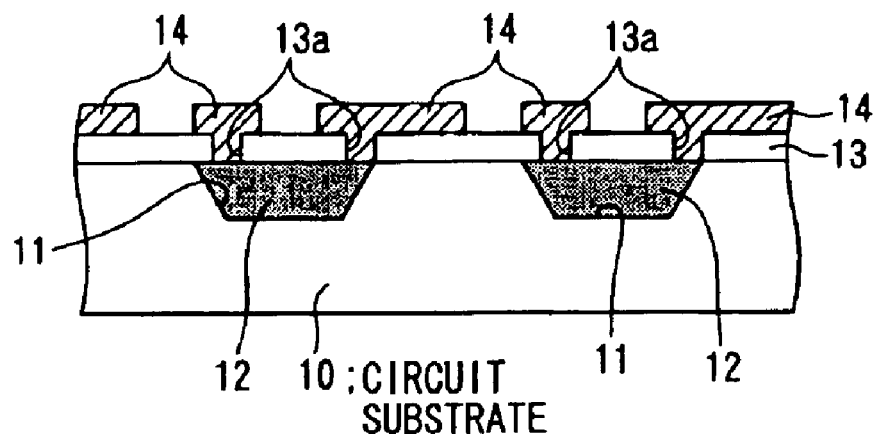
FIG. 1 is a cross-sectional view showing the construction of a circuit substrate.
Figure 2:
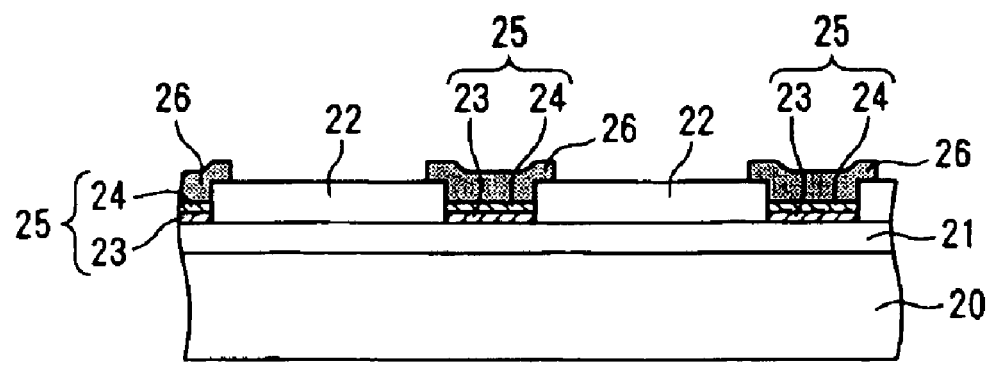
FIG. 2 is a cross-sectional view showing the construction of a transparent substrate.
Figure 3:
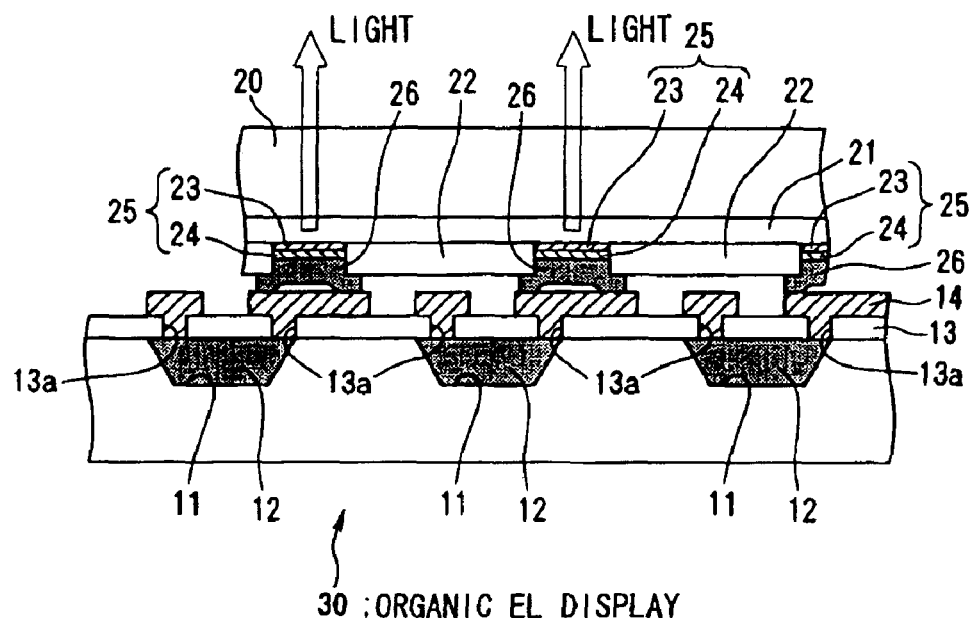
FIG. 3 is a cross-sectional view showing the construction of an organic EL display.

FIG. 1 through FIG. 3 are diagrams illustrating a first embodiment of the present invention, FIG. 1 being cross-sectional view showing the construction of a circuit substrate 10 before being stuck, FIG. 2 being a cross-sectional view showing the construction of a transparent substrate 20 before being stuck, and FIG. 3 being a cross-sectional view showing the construction of an organic EL display 30 manufactured by sticking both members together.

That is, as shown in FIG. 1, on the surface of the circuit substrate 10 comprising an insulating material, there is formed a plurality of concavities 11 corresponding to the position of pixels of the organic EL display 30 which is made later, and inside these concavities 11 are inlayed microstructures 12. Then, the surface of the circuit substrate 10, in a condition with the microstructures inlayed therein, is covered by a protective film 13 made of an insulating material.

In the protective film 13 is formed through holes 13a for exposing electrode pads (not shown in the figure) formed on the surface of the microstructures 12, and wiring 14 such as scanning lines or signal lines is formed so as to conduct with the electrode pads through the through holes 13a.

As a manufacturing method for the microstructures 13, and a method of setting these in the concavities 11, the methods disclosed for example in U.S. Pat. Nos. 5,904,545, 5,824,186, 5,783,856 and 5,545,291 may be applied. Furthermore, for the depositing method for the protective film 13, the method of opening the through holes 13a, and the patterning method for the wiring 14, known depositing methods and photolithography processes may be adopted.

On the other hand, as shown in FIG. 2, a transparent electrode layer 21 is deposited over the entire surface of the transparent substrate 20 made from a transparent synthetic resin or glass. Then, on the upper face of the transparent electrode layer 21 in the pixel forming regions which are mutually separated by banks 22 made of insulating material, is laminated from the transparent electrode layer 21 side, a hole injection layer 23, an organic EL layer 24 and a cathode layer 26, to thereby manufacture the emissive layer 25 with the hole injection layer 23 and the organic EL layer 24. For the materials for forming the transparent electrode layer 21, the hole injection layer 23, the organic EL layer 24 and the cathode layer 26, materials the same as known materials used in organic EL displays may be applied. Also, for the method of forming these, known manufacturing methods may be applied.

Then, the circuit substrate 10 shown in FIG. 1 and the transparent substrate 20 shown in FIG. 2 are stuck together as shown in FIG. 3 with the side formed with the wiring 14 and the side formed with the cathode layer 26 facing the inside, to thereby manufacture the organic EL display 30. Consequently, it is necessary to perform alignment of the circuit substrate 10 and the transparent substrate 20 and sticking together so that the portions of the wiring 14 to be connected to the cathode layer 26, and the cathode layer 26 are electrically connected. Furthermore, in the sticking together of the circuit substrate 10 and the transparent substrate 20, since a known anisotropic conductive paste or an anisotropic conductive film is used, then unanticipated short circuits and the like can be avoided.

In this manner, according to the present embodiment, the circuit substrate 10 in which is set the microstructures 12, and the transparent substrate 20 formed with the emissive layer 25 and the cathode layer 26 are manufactured separately. In order to manufacture the organic EL display 30 with these two stuck together, then with regards to the circuit substrate 10, since the necessary processes are only a few after inlaying the microstructures 12 in the concavities 11, the possibility of the microstructures 12 made with electronic circuit elements such as transistors, capacitors and the like, being damaged by the manufacturing process can be greatly reduced.

Furthermore, since the circuit substrate 10 and the transparent substrate 20 are manufactured in separate processes, there is also the effect of an increase in yield. Depending on the situation, a manufacturing method is also possible where the circuit substrate 10 and the transparent substrate 20 are respectively manufactured at separate factories, or by different enterprises, and then finally the two are stuck together. Therefore this is also extremely effective in reducing manufacturing costs.

Furthermore, as also shown in FIG. 3, the light generated from the emissive layer 25 shines to the outside through the transparent electrode layer 21 and the transparent substrate 20. That is, the entire rear face side of the transparent substrate 20 becomes the screen of the organic EL display 30. However since wiring and the like which blocks light is not made on the transparent substrate 20, the aperture ratio of the organic EL display 30 can be made extremely high.

Moreover, the pitch of each pixel of the organic EL display 30 is determined by the pitch of the emissive layer 25 made on the transparent substrate 20, and the positioning accuracy at the time of sticking together the circuit substrate 10 and the transparent substrate 20 does not have any effect on the pitch of the pixels. Therefore, even if a manufacturing method involving sticking together as with the present embodiment is adopted, there is no drop in the accuracy of the pixel pitch of the organic EL display 30.

In this manner, according to the manufacturing method of the present embodiment, the organic EL display 30 can be extremely efficiently manufactured.

Figure 4:
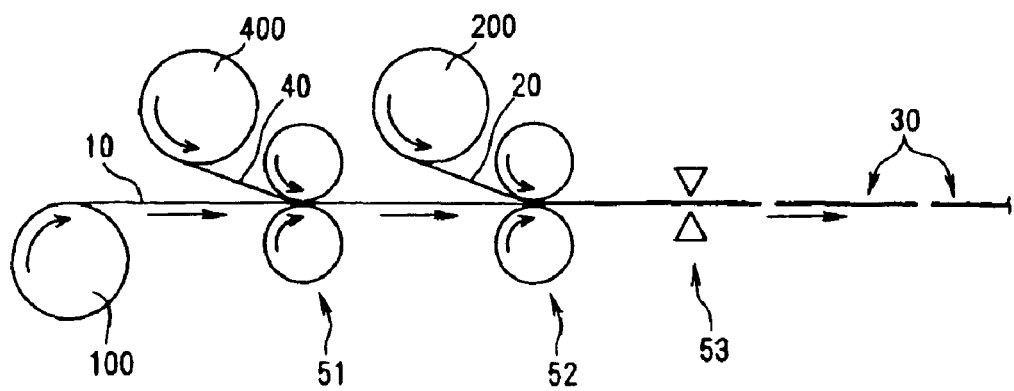
FIG. 4 is a diagram illustrating a manufacturing process using rolls.

FIG. 4 is a diagram showing a second embodiment of the present invention, being a scheme for a sticking together process for the circuit substrate 10 shown in FIG. 1 and the transparent substrate 20 shown in FIG. 2.

That is, in this embodiment, on the surface of a long length circuit substrate 10 is formed the wiring 14 and the like as shown in FIG. 1, and a roll 100 is then prepared with the long length circuit substrate 10 rolled so that the wiring 14 side is on the outer surface side. Moreover, on the surface of a long length transparent substrate 20 of the same width as the circuit substrate 10 is formed an emissive layer 25 and the like as shown in FIG. 2, and a roll 200 is then prepared with the long length transparent substrate 20 rolled so that the cathode layer 26 side is on the outer surface side. Furthermore, a roll 400 made by rolling an anisotropic conductive film 40 of the same width as the circuit substrate 10 is also prepared.

Next, a pair of upper and lower pressing rollers 51 and 52 are positioned one in front of the other, the roll 100 and the roll 400 are arranged at the insertion side of the upstream pressing rollers 51, the roll 200 is arranged at the insertion side of the downstream pressing rollers 52, and a cutting device 53 is arranged further on the downstream side of the downstream pressing rollers 52.

Then, the long length circuit substrate 10 unwound from the roll 100 is inserted into the pressing rolls 51 with the wiring 14 side facing upwards, the anisotropic conductive film 40 unwound from the roll 400 is inserted into the same rollers 51 so as to lie on the upper face of the circuit substrate 10, and the two are made into one by the pressing force of the pressing rollers 51.

The circuit substrate 10 and the anisotropic conductive film 40 which have passed through the pressing rolls 51 are then continuously inserted into the pressing rollers 52, and the long length transparent substrate 20 which is unwound from the roll 200 is also inserted into the pressing rollers 52 in a condition with the cathode layer 26 facing downward and so as to lie on the circuit substrate 10 and while performing alignment of the two as described for the first embodiment. By so doing, due to the pressing force of the pressing rollers 52 and the adhesive strength of the anisotropic conductive film 40, the circuit substrate 10 and the transparent substrate 20 are stuck together in the condition as shown in FIG. 3.

Furthermore, the stuck together product of the circuit substrate 10 and transparent substrate 20 which has passed through the pressing rollers 52 is cut into predetermined lengths in the cutting device 53, to thereby give the organic EL display 30.

In this manner, according to the present embodiment, by using the previously prepared rolls 100, 200 and 400, the organic EL display 30 can be continuously manufactured. Therefore the manufacturing cost thereof can be further reduced.

In the above embodiment, the description has been given for an organic EL display as one example of an electro-optic device. However the present invention where microstructures formed with drive circuits are positioned in concavities on one substrate, and electro-optic elements are formed on an other substrate and these substrates are then stuck together, may, other than the organic EL substrate, be applied to electro-optic devices of the self luminescent type such as plasma displays and electro-optic devices such as liquid crystal displays which use film liquid crystals.

Electronic Devices

Next is a description of examples of electronic devices incorporating the abovementioned EL element drive circuits and EL display panels which are driven by these drive circuits.

FIRST EXAMPLE

Mobile Type Computer

Figure 5:
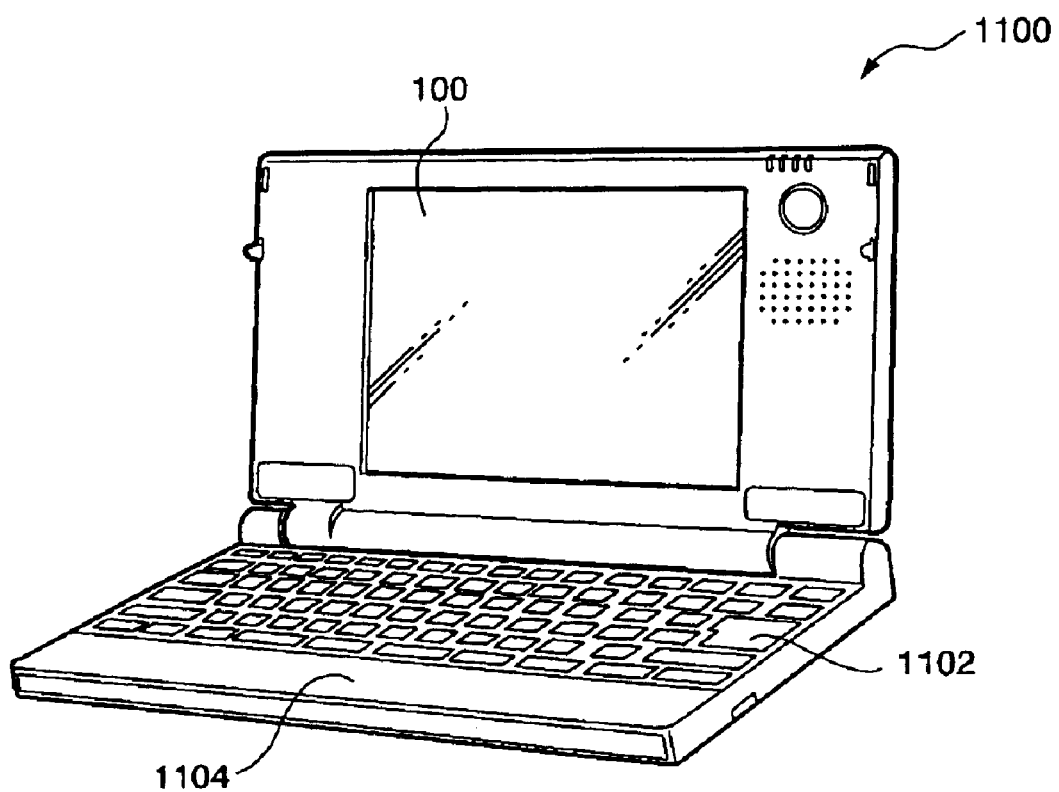
FIG. 5 is a perspective view illustrating a construction of a personal computer being an example of an electronic device of the present invention.

At first is a description of an example for where an organic EL display panel according to the embodiments is applied to a mobile type personal computer. FIG. 5 is a perspective view illustrating the construction of this personal computer. In the figure, a personal computer 1100 comprises a main frame 1104 incorporating a key board 1102, and a display unit 1106. The display unit 1106 has an organic EL display panel 100.

SECOND EXAMPLE

Portable Telephone

Figure 6:
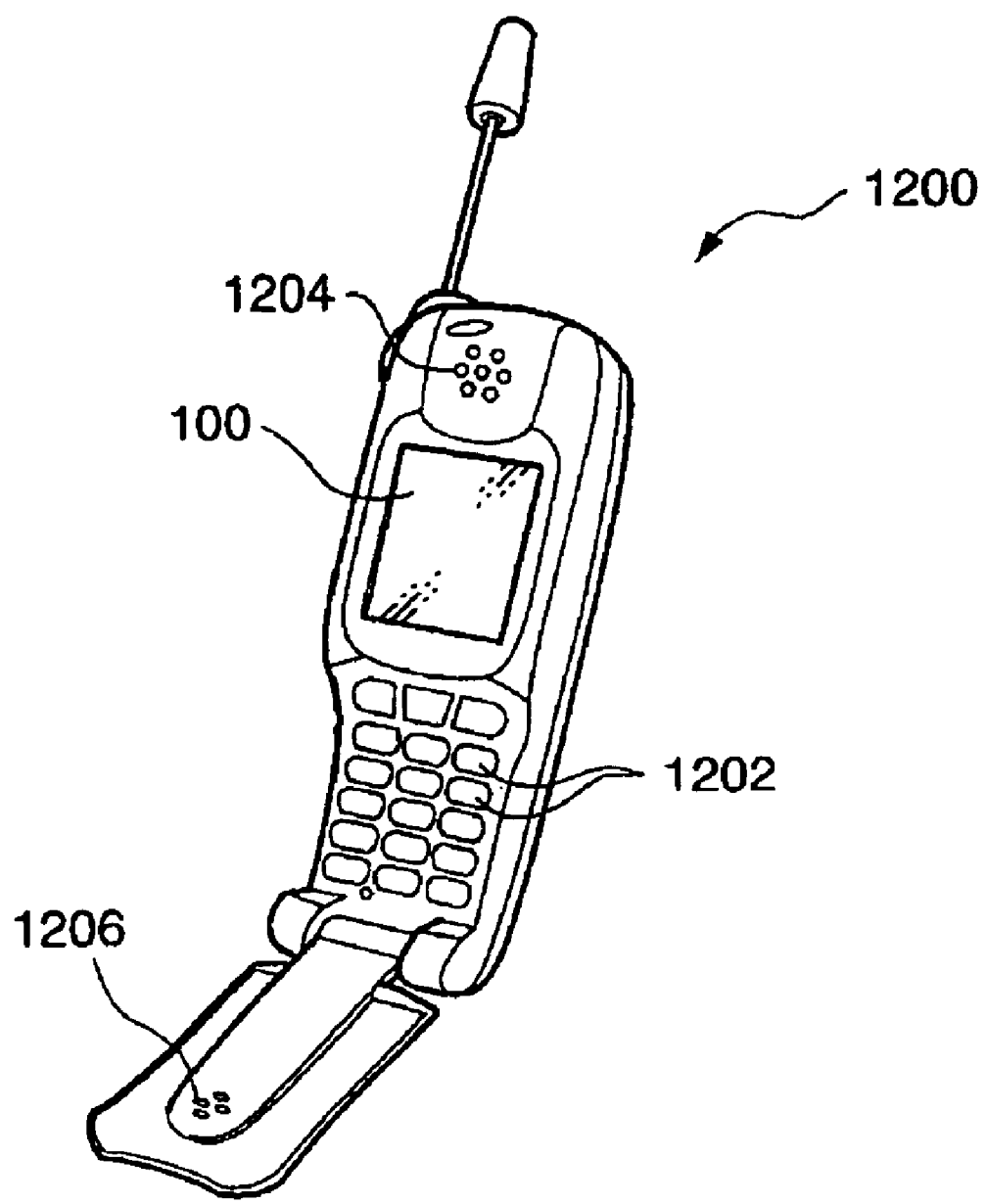
FIG. 6 is a perspective view illustrating a construction of a portable telephone being an example of an electronic device.

Next is a description of an example for where an organic EL display panel is applied to a display portion of a mobile telephone. FIG. 6 is a perspective view illustrating the construction of this mobile telephone. In the figure, a mobile telephone 1200 incorporates a plurality of operating buttons 1202 as well as, an earpiece 1204, a mouth piece 1206 and the abovementioned organic EL display panel 100.

THIRD EXAMPLE

Digital Still Camera

Figure 7:
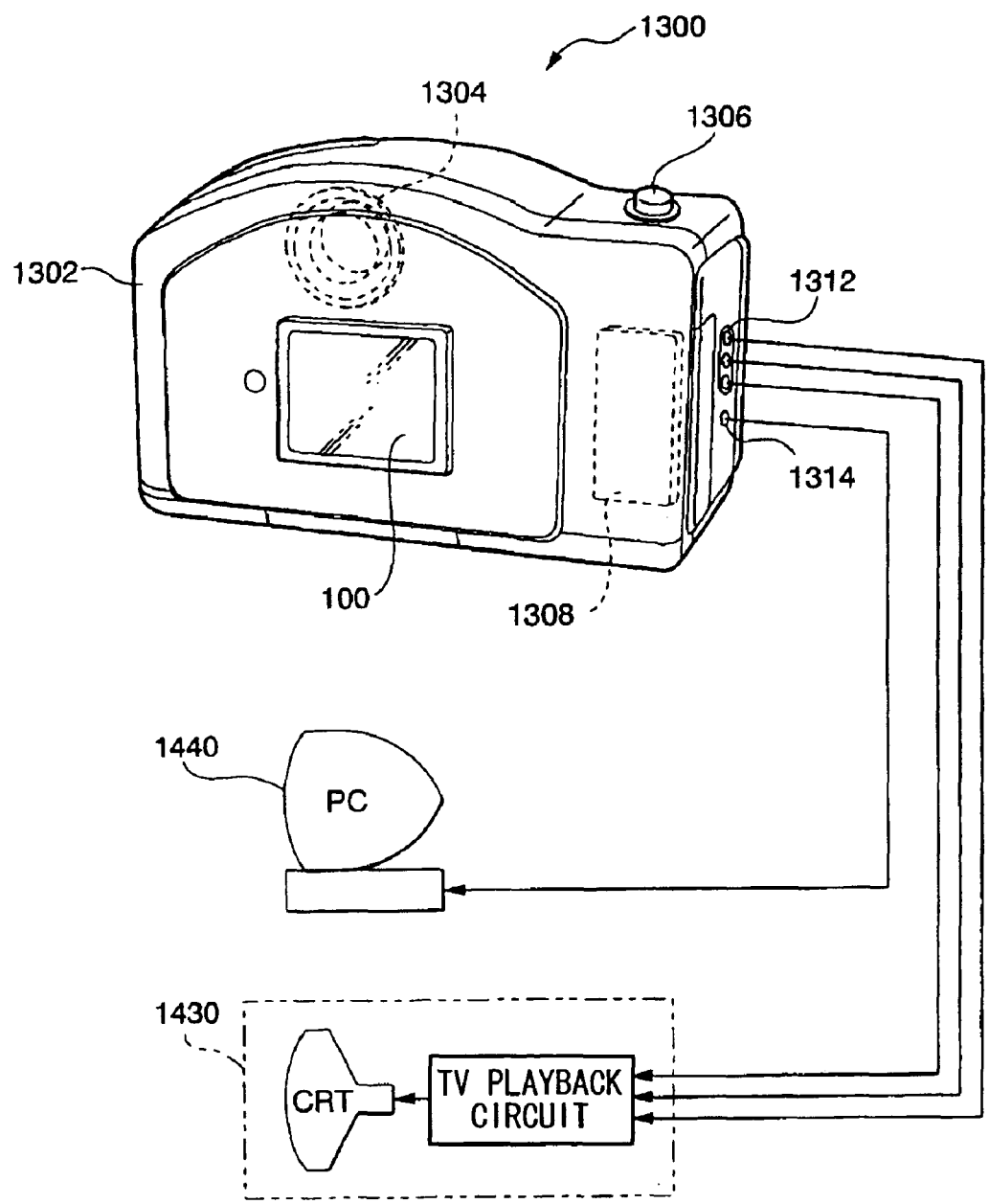
FIG. 7 is a perspective view illustrating a construction of a rear face side of a digital still camera being an example of an electronic device.

Next is a description of a digital still camera which uses an organic EL display panel in a finder. FIG. 7 is perspective view illustrating the construction of this digital still camera, with connections for external equipment also shown simplified.

In contrast to a normal camera where the film is exposed by an optical image of a photographic subject, with the digital still camera 1300, the optical image of the photographic subject is photoelectrically converted by an imaging element such as a CCD (charged coupled device) to thereby produce an image signal. Here, the construction is such that the abovementioned organic EL display panel 100 is provided on a back face of a case 1302 of the digital still camera 1300, and display is performed based on the image signal from the CCD. Therefore the organic EL display panel 100 functions as a finder for displaying the photographic subject. Furthermore, on the viewing side (the rear face side in the figure) of the case 1302 there is provided a light receiving unit 1304 which includes an optical lens and a CCD or the like.

Here, when the photographer has confirmed the subject image displayed on the organic EL display panel 100 and pushes a shutter button 1306, the image signal from the CCD at that time is sent to a memory of a circuit substrate 1308 and stored therein. Furthermore, in this digital still camera 1300, on the side face of the case 1302 there is provided a video signal output terminal 1312 and an input-output terminal 1314 for data communication. Moreover, as shown in the figure, as required, a television monitor 1430 is connected to the former video signal output terminal 1312, or a personal computer 1430 is connected to the later data communication input-output terminal 1314. Furthermore, the construction is such that by a predetermined operation, the imaging signal stored in the memory of the circuit substrate 1308 is output to the television monitor 1430 or the personal computer 1440.

For the electronic device, in addition to the personal computer of FIG. 5, the mobile telephone of FIG. 6, or the digital still camera of FIG. 7, there can be given devices such as a liquid crystal television, a view finder type or direct view monitor type video recorder, a car navigation unit, a pager, an electronic notebook, an electronic calculator, a word processor, a work station, a video phone, a POS terminal, a device furnished with a touch panel and so on. Moreover, needless to say for the display portion of these various electronic devices, the abovementioned display device can be applied.

What is claimed is:

1. A manufacturing method for a display which uses an organic EL element in a display portion, comprising the steps of:

preparing a circuit substrate with microstructures made with drive circuits for said organic EL element set at positions corresponding to pixels, a protective film made of an insulating material covering the microstructures, the protective film having through holes, and with wiring formed on the surface connecting to the microstructures through the through holes;

separately preparing a transparent substrate with a transparent electrode layer common with the pixels laminated on the surface, forming an insulating layer with openings therein separated by banks of insulating material on the transparent electrode layer, and forming an emissive layer containing an organic EL layer and a cathode layer in the openings in the insulating layer at positions corresponding to said pixels, the cathode layer having a protruding portion protruding from each of the openings, in which a concave portion is formed on a surface of the protruding portion at an area corresponding to each of the pixels, a part of the protruding portion covering a part of the banks; and then sticking together said circuit substrate and said transparent substrate with the side on which said wiring of said circuit substrate is formed and the side on which said cathode layer of said transparent substrate is formed facing towards the inside.

2. The manufacturing method for an organic EL display according to claim 1, the sticking together of said circuit substrate and said transparent substrate being performed by inserting an anisotropic conductive paste or an anisotropic conductive film therebetween.

3. The manufacturing method for an organic EL display according to claim 1, involving respectively preparing a roll of said circuit substrate, and a roll of said transparent substrate, and then unrolling said circuit substrate and said transparent substrate from these rolls while inserting an anisotropic conductive film therebetween, and pressing with a pressing roller from font and rear surfaces to thereby stick together said circuit substrate and said transparent substrate.

4. The manufacturing method for an organic EL display according to claim 3, after sticking together said circuit substrate and said transparent substrate, the stuck together product being cut to an optional length.

5. An organic EL display which uses an organic EL element in a display portion, microstructures made with drive circuits for said organic EL element being set at positions corresponding to pixels of a first substrate, a protective film made of an insulating material with through holes covering the microstructures, wiring passing through the through holes to connect to the microstructures, and a second substrate comprising: a plurality of emissive layer portions and a plurality of cathodes formed in openings in an insulating material; and banks of the insulating material separating the plurality of emissive layer portions, each of the cathodes having a protruding portion protruding from each of the openings, in which a concave portion is formed on a surface of the protruding portion at an area corresponding to each of the pixels, a part of the protruding portion covering a part of the banks, and these first substrate and second substrate being stuck together.

6. An organic EL display which uses an organic EL element in a display portion, a circuit substrate with microstructures made with drive circuits for the organic EL element set at positions corresponding to pixels, a protective film made of an insulating material covering the microstructures, the protective film having through holes, and with wiring formed on the surface connecting to the microstructures through the through holes, and a transparent substrate with a transparent electrode layer common with the pixels laminated on the surface, and an array of active areas, each area having an emissive layer containing the organic EL layer and a cathode layer laminated on the upper surface of said transparent electrode layer at a position corresponding to said pixels, said active areas being separated by banks of insulating material on the transparent electrode layer, the cathode layer having a protruding portion protruding from each of the active areas, in which a concave portion is formed on a surface of the protruding portion at an area corresponding to each of the pixels, a part of the protruding portion covering a part of the banks; and the circuit substrate and transparent substrate being stuck together with the side on which said wiring of said circuit substrate is formed and the side on which said cathode layer of said transparent substrate is formed facing towards the inside.

7. The organic EL display according to claim 6, said circuit substrate and said transparent substrate being stuck together by inserting an anisotropic conductive paste or an anisotropic conductive film therebetween.

8. A manufacturing method for an electro-optic device which uses electro-optic elements in a display portion, comprising the steps of:

preparing a first substrate with microstructures formed with drive circuits for said electro-optic elements set at positions corresponding to pixels, a protective film made of an insulating material with through holes covering the microstructures, wiring passing through the through holes to connect to the microstructures;

preparing a second substrate with said electro-optic elements and plurality of cathodes formed in openings in an insulating material at positions corresponding to said pixels, said electro-optic elements being separated by banks of the insulating materials, each of the cathodes having a protruding portion protruding from each of the openings, in which a concave portion is formed on a surface of the protruding portion at an area corresponding to each of the pixels, a part of the protruding portion covering a part of the banks; and then sticking together said first substrate and said second substrate with the side of said first substrate on which said drive circuits are formed and the side of said second substrate on which said electro-optic elements are formed facing towards the inside.

9. An electro-optic device which uses electro-optic elements in a display portion, microstructures made with drive circuits for said electro-optic elements being set at positions corresponding to pixels of a first substrate, a protective film made of an insulating material with through holes covering the microstructures, wiring passing through the through holes for connecting to the microstructures, and a second substrate having: a plurality of emissive layer portions and a plurality of cathodes formed in openings in an insulating material; and banks of the insulating material separating the openings, each of the cathodes having a protruding portion protruding from each of the openings, in which a concave portion is formed on a surface of the protruding portion at an area corresponding to each of the pixels, a part of the protruding portion covering a part of the banks, and said first substrate and second substrate being stuck together.

10. An electronic device provided with the electro-optic device according to claim 9.

11. A method of manufacturing a display using an organic EL element in a display portion comprising the steps of:

preparing a circuit substrate with drive circuits for the organic EL element set at positions corresponding to pixels;

covering the drive circuits with a protective film made of an insulating material, the protective film having a plurality of through holes;

connecting a plurality of wires to the drive circuits by passing the plurality of wires through the plurality of through holes;

preparing a transparent substrate, the transparent substrate including:

a transparent electrode layer common with the pixels laminated on the surface;

an insulating layer on the surface, said insulating layer having openings therein and banks of an insulating material separating the openings, each opening containing an emissive layer containing an organic EL layer and a cathode layer laminated on the upper surface of the transparent electrode layer at a position corresponding to the pixels, the cathode layer having a protruding portion protruding from each of the openings, in which a concave portion is formed on a surface of the protruding portion at an area corresponding to each of the pixels, a part of the protruding portion covering a part of the banks; and joining the circuit substrate to the transparent substrate by connecting the plurality of wires of the circuit substrate to the cathode layer of the transparent substrate.

12. The method of claim 11, wherein the drive circuits are included in microstructures.

13. The method of claim 11, wherein joining the circuit substrate to the transparent substrate further includes the step of inserting an anisotropic conductive paste between the circuit substrate and the transparent substrate.

14. The method of claim 11, wherein joining the circuit substrate to the transparent substrate further includes the step of inserting an anisotropic conductive film between the circuit substrate and transparent substrate.

15. The method of claim 11 further comprising the steps of:

rolling the circuit substrate into a circuit substrate roll;

rolling the transparent substrate into a transparent substrate roll;

unrolling the circuit substrate and the transparent substrate from the circuit and transparent substrate rolls;

inserting an anisotropic conductive film between the circuit substrate and the transparent substrate; and pressing the circuit substrate and the transparent substrate together with a pressing roller, the pressing roller pressing the circuit substrate and the transparent substrate from front to rear.

16. The method of claim 15 further including the step of cutting the circuit substrate and the transparent substrate to an optional length.

17. An organic EL display using an organic EL element in a display portion comprising:

drive circuits formed on a first substrate for the organic EL element being set at positions corresponding to pixels;

a protective film formed from an insulating material with a plurality of through holes covering the drive circuits;

a plurality of wires passing through the plurality of through holes with a first end connecting to the drive circuits;

an emissive layer containing a plurality of organic EL portions; and an insulating layer containing: openings in which the organic EL portions and a plurality of cathodes are formed at positions corresponding to the pixels; and banks of an insulating material separating the plurality of organic EL portions, each of the cathodes having a protruding portion protruding from each of the openings, in which a concave portion is formed on a surface of the protruding portion at an area corresponding to each of the pixels, a part of the protruding portion covering a part of the banks, and the first substrate and second substrate being joined together.

18. The organic EL display of claim 17 further comprising a plurality of microstructures, the drive circuits being included therein.

19. An organic EL display which uses an organic EL element in a display portion comprising:

a circuit substrate having a plurality of drive circuits for the organic EL element set at positions corresponding to a plurality of pixels;

a protective film made of an insulating material covering the drive circuits, the protective film having a plurality of through holes;

a plurality of wires connecting to the microstructures through the plurality of through holes;

a transparent substrate including:
- a transparent electrode layer on a surface of the transparent substrate; and
- an insulating layer on the transparent electrode layer, said insulating layer having an array of openings therein and banks of an insulating material separating the openings, each opening containing an emissive layer containing the organic EL element and a cathode layer laminated on the upper surface of the transparent electrode layer at a position corresponding to the pixels, the cathode layer having a protruding portion protruding from each of the openings, in which a concave portion is formed on a surface of the protruding portion at an area corresponding to each of the pixels, a part of the protruding portion covering a part of the banks, the plurality of wiring of the circuit substrate joining with the cathode layer of the transparent substrate.

20. The organic EL display of claim 19 further comprising a plurality of microstructures, the drive circuits being included therein.

21. The organic EL display of claim 19 wherein joining the circuit substrate to the transparent substrate includes inserting an anisotropic conductive paste between the circuit substrate and the transparent substrate.

22. The organic EL display of claim 19 wherein joining the circuit substrate to the transparent substrate includes inserting an anisotropic conductive film between the circuit substrate and the transparent substrate.

23. A manufacturing method for an electro-optic device using electro-optic elements in a display portion comprising the steps of:
- preparing a first substrate having drive circuits for the electro-optic elements set at positions corresponding to pixels;
- covering the drive circuits with a protective film made of an insulating material with a plurality of through holes;
- passing a plurality of wires through the plurality of through holes to connect to the drive circuits;
- preparing a second substrate with the electro-optic elements and a plurality of cathodes formed in openings in an insulating layer at positions corresponding to the pixels, the electro-optic elements being separated by banks of an insulating material, each of the cathodes having a protruding portion protruding from each of the openings, in which a concave portion is formed on a surface of the protruding portion at an area corresponding to each of the pixels, a part of the protruding portion covering a part of the banks; and
- joining the first substrate and the second substrate such that the drive circuits of the first substrate and the electro-optic elements of the second substrate are placed between the first and second substrate.

24. The manufacturing method of claim 23 further comprising a plurality of microstructures, the drive circuits being included therein.

25. An electro-optic device that uses electro-optic elements in a display portion comprising:
- a plurality of drive circuits for the electro-optic elements being set at positions corresponding to pixels of a first substrate;
- a protective film made of an insulating material with a plurality of through holes covering the drive circuits;
- a plurality of wires passing through the plurality of through holes for connecting to the drive circuits;
- an electro-optic layer containing the electro-optic elements and being formed in openings in an insulating layer on a second substrate;
- banks of an insulating material separating the openings; and
    - a cathode layer formed in each of the openings and having a protruding portion protruding from each of the openings, in which a concave portion is formed on a surface of the protruding portion at an area corresponding to each of the pixels, a part of the protruding portion covering a part of the banks, wherein the first substrate and second substrate are joined together.

26. The electro-optic device of claim 25 further comprising a plurality of microstructures, the drive circuits being included therein.

27. The electro-optic device of claim 25 further comprising an electronic device.

* * * * *